| United States Patent [19] | [11] Patent Number: 4,842,989 |
| Taniguchi et al. | [45] Date of Patent: Jun. 27, 1989 |

[54] RESIST LAYER AND PROCESS FOR FORMING RESIST PATTERN THEREON

[75] Inventors: Ichiro Taniguchi, Kyoto; Hideo Hotomi, Suita; Izumi Osawa, Ikeda, all of Japan

[73] Assignee: Minolta Camera Kabushiki Kaisha, Osaka, Japan

[21] Appl. No.: 134,060

[22] Filed: Dec. 17, 1987

[30] Foreign Application Priority Data

Dec. 19, 1986 [JP] Japan ................................. 61-304981

[51] Int. Cl.$^4$ ................................................ G03C 5/00
[52] U.S. Cl. .................................... 430/296; 430/270; 430/326; 525/330.3; 525/359.1
[58] Field of Search ............... 430/270, 273, 296, 942, 430/326, 327, 285; 525/330.3, 359.1

[56] References Cited

U.S. PATENT DOCUMENTS 4,421,843  12/1983  Hattori et al. ..................... 430/322

OTHER PUBLICATIONS

"Plasma Polymerization", Y. Osada et al, *Tokyo Chemical Coterie*, pp. 191–202 (Sep. 9, 1986).

*Primary Examiner*—José G. Dees
*Attorney, Agent, or Firm*—Burns, Doane, Swecker & Mathis

[57] ABSTRACT

A resist layer comprising an organic polymer which is formed by subjecting a methacrylate incorporating fluorine and/or an acrylate incorporating fluorine to a glow-discharge plasma polymerization process.

Further, a process for forming resist pattern on the resist layer comprising a step of forming the resist layer; a step of forming a latent image by exposing the resist layer to an electron beam; and a step of visualizing the latent image by plasma etching.

6 Claims, 4 Drawing Sheets

RESIST LAYER AND PROCESS FOR FORMING RESIST PATTERN THEREON

BACKGROUND OF THE INVENTION

1. Field Of The Invention

The present invention relates to a resist layer and its resist pattern formation process, said resist layer being particularly applicable to dry processes.

2. Description Of The Prior Art

Resist processes have long been applied to integrated circuit microprocessing, but advanced microprocesses have become necessary with the advent of advanced integrated circuits.

Resist processes broadly comprise a resist layer formation process, latent image formation process and a developing process. Conventional resist processes include the use of a fluid in a wet process in each of the above processing steps. In a resist layer formation process, for example, the resist layer is spread on a substrate. In a developing process a latent image is immersed in developing fluid and the soluble portion of the resist is dissolved so as to obtain a resist pattern.

These types of wet processes have the following disadvantages when applied to the formation of microresist patterns. In a resist layer formation process employing wet processes, the resist material is highly purified and coating homogeneity is regulated by controlling the composition, concentration, viscosity, dispersion processes and the like. Also, the application and polymerization processes are controlled due to the need to form a uniformly thin layer, thereby increasing processing complexity and costs, and reducing efficiency. Additionally, in related developing processes, decreased resolution induced by resist layer imbibition may result from the required use of a fluid developer, or an organic solvent, alkaline aqueous solution or like agent as a rinse. Furthermore, safety is reduced by the use of chemicals and pattern defects may arise due to dust adhesion during the drying process or transporting process.

Attention has recently been focused on dry processes which do not employ liquids for the resist formation process and/or developing process as a means of solving the aforesaid disadvantages.

Successful electron beam (EB) drawn resist layers applicable to resist processes in dry process resist formation and/or developing process are, for example, PMMA (KTI, DuPont, etc.), OEBR1030 (Tokyo Okasei), CP3 (Tokyo Okasei), EBR9 (Toray Industries), FBM (Daikin), PM (Microimage), PBS (Mead Tech), 1350 (Hoechst Shipley), RE5000P (Hitachi), and the like.

The aforesaid electron beam drawn resists, however, all lack adequately high sensitivity and are not sufficiently resistant to dry etching.

Conventional resist processes, on the other hand, require that the post-development negative resist layer remaining on the drawn portion of the resist and the post-development positive resist layer remaining on the non-drawn portion of the resist be properly handled according to the objectives. Accordingly, a problem arises wherein two types of resists, positive and negative, necessitate the selection of suitable resist materials.

SUMMARY OF THE INVENTION

A principal object of the present invention is to provide a resist layer which is applicable to resist processes including dry processes.

Another object of the invention is to provide a high-sensitivity, etching-resistant advanced resist layer for use in a resist process employing an electron beam drawing or other dry etching process.

A further object of the invention is to provide a resist layer applicable to negative- and positive-resist processes.

A still further object of the invention is to provide a resist pattern formation process which allows the formation of an optionally negative or positive image resist pattern without the use of a wet process.

These and other objects of the invention are achieved by subjecting at least a methacrylate incorporating fluorine and/or an acrylate incorporating fluorine to a glow-discharge plasma polymerization process to form a resist layer comprising an organic polymer.

These and other objects of the invention are accomplished by providing a resist pattern formation process comprising a resist layer formation process wherein an organic polymer layer is formed by subjecting at least a methacrylate incorporating fluorine and/or an acrylate incorporating fluorine to a glow-discharge plasma polymerization process, a latent image formation process wherein said latent image is formed by exposing said resist layer to an electron beam, and a visualized image formation process said latent image is visualized by plasma etching.

DETAILED DESCRIPTION OF THE INVENTION

Figure 1:
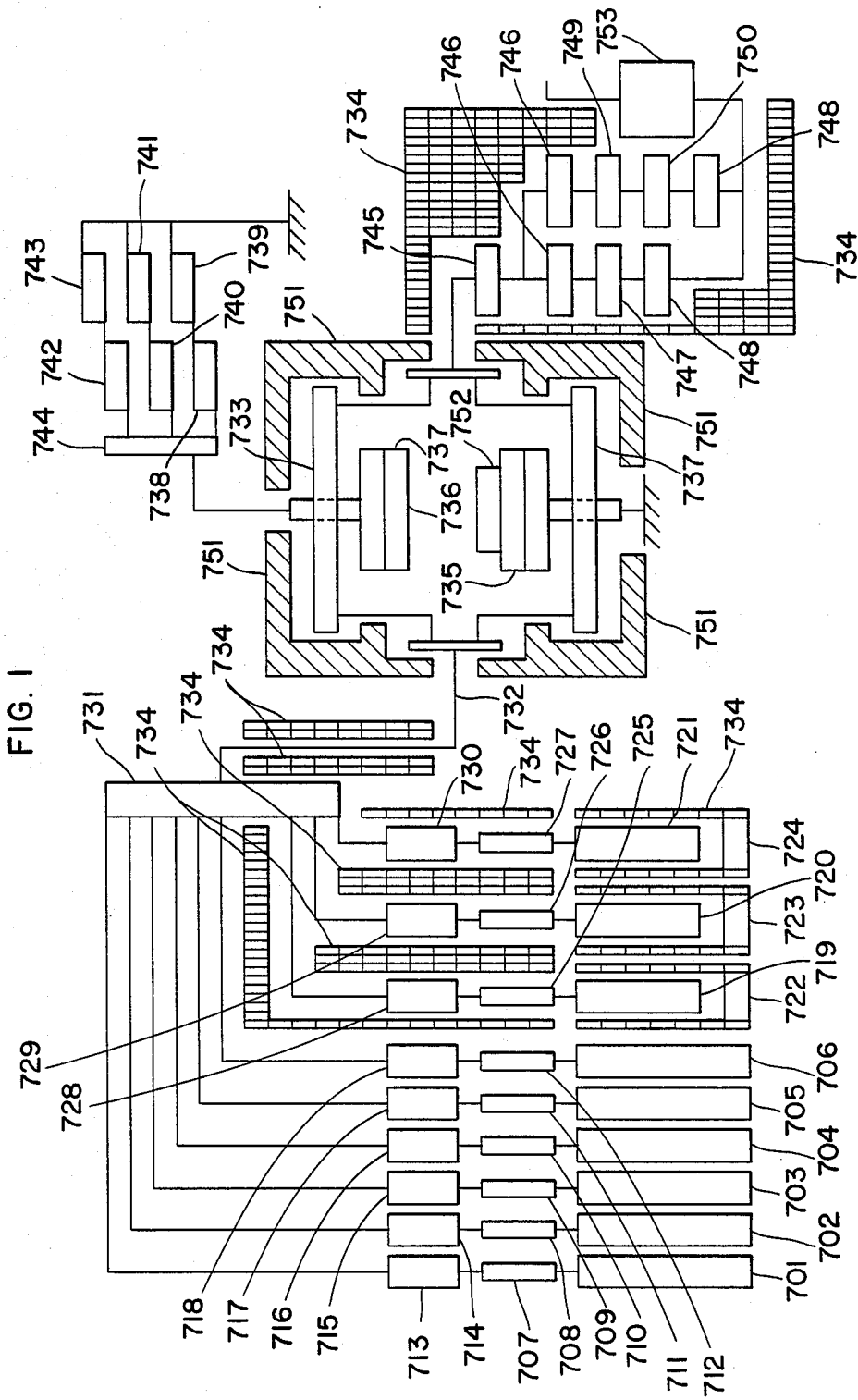
FIG. 1 shows the resist layer formation and dry etching apparatuses related to the present invention.

The present invention employs at least a methacrylate incorporating fluorine and/or an acrylate incorporating fluorine in resist layer manufacture. Examples of useful methacrylates with fluorine and acrylates with fluorine are 2,2,2-trifluoroethylmethacrylate $CH_2=C(CH_3)COOCH_2CF_3$, 2,2,3,3-tetrafluoropropyl methacrylate $CH_2=C(CH_3)COOCH_2(CF_2)_2H$, 1H,1H,5H-octafluoropentylmethacrylate $CH_2=C(CH_3)COOCH_2(CF_2)_4H$, 1H,1H,2H,2H-heptadecafluorodecylmethacrylate $CH_2=C(CH_3)COO(CH_2)_2(CF_2)_8F$, 2,2,2-trifluoroethylacrylate $CH_2=CHOOCH_2CF_3$, 2,2,3,3-tetrafluoropropylacrylate $CH_2=CHCOOCH_2(CF_2)_2H$, 1H,1H,5H-octafluoropentylacrylate $CH_2=CHOOCH_2(CF_2)_4H$, 1H,1H,2H,2H-heptadecafluorodecylacrylate $CH_2=CHOO(CH_2)_2(CF_2)_8$ and the like. Particularly preferred acrylates are 1H,1H,5H-octafluoropentylmethacrylate $CH_2=C(CH_3)COOCH_2(CF_2)_4H$, and 1H,1H,5H-octafluoropentylacrylate $CH_2=CHCOOCH_2(CF_2)_4H$.

These organic compounds may be in either liquid or solid phase at room temperature and pressure, but are be readily melted and vaporized via heating or pressure reduction. Accordingly, the plasma polymerization reaction of the present invention may be readily accomplished via a conventional plasma chemical vapor deposition (CVD) process. The following is an example of a plasma CVD reaction which produces a polymer. When at least a methacrylate containing fluorine and/or an acrylate containing fluorine are in vapor phase and subjected to a glow-discharge decomposition process at reduced pressure, the activated neutral constituents or charged constituents in the generated plasma atmosphere are diffused on the substrate and subjected to induction by electric or magnetic force, thereby inducing a recombination reaction of said constituents which are then deposited on the substrate as a solid.

The preferred thickness of this organic polymer layer is 0.01 to 10 $\mu$m. When the layer thickness is less than 0.01 $\mu$m, etching resistance cannot necessarily be assured. When the layer thickness is more than 10 $\mu$m, the time required for the organic polymer layer formation and the time required for drawing, etching and the like are significantly increased, which is undesirable from a production standpoint. The preferred rate of deposition for the organic polymer layer is 0.001 to 0.5 $\mu$m/min. When the deposition rate is less than 0.001$\mu$m/min, the sensitivity of the resist layer, which comprises the organic polymer layer, to the electron beam exposure is undesirably reduced. Likewise, when the deposition rate is greater than 0.5 $\mu$m/min, the formability of the organic polymer layer is reduced, thereby producing an uneven layer and undesirably reducing the quality of the covering on the substrate surface. The thickness of the organic polymer layer can be readily controlled by regulating the layer formation time.

Although there are differences in the controlled variables depending on the plasma CVD apparatus used, the organic polymer layer deposition rate is readily controllable in that an increase in the deposition rate can be regulated by increasing the flow rate of the aforesaid organic compound(s), increasing the applied voltage, decreasing the frequency of the applied voltage, reducing the substrate temperature or similar means, or any combination thereof.

The organic polymer layer thus manufactured is useable as it stands as a negative resist layer, and can be used as a positive resist layer by exposing it to carbon tetrafluoride plasma after layer formation. Although the carbon tetrafluoride plasma exposure time must be regulated according to the plasma conditions as well as the thickness of the organic polymer layer, 1 to 30 min is generally suitable. In addition, the plasma CVD apparatus used to manufacture the organic polymer layer may also be used without modification for the carbon tetrafluoride plasma exposure.

The negative-to-positive reversal of the organic polymer layer via exposure to carbon tetrafluoride plasma is ambiguous even to the inventors, who surmise that this reversal is caused by the incorporation of carbon or fluorine atoms into the organic polymer layer, said incorporation being induced by the carbon tetrafluoride plasma, or that atoms from stainless components normally found in vacuum vessels are caused to sputter by the carbon tetrafluoride plasma and adhere to the surface of the organic polymer layer.

The resist pattern formation process of the present invention employs a conventional electron beam drawing process, for example, a vector scanning method or raster scanning method, in the latent image formation process. Examples of useful electron beams are point electron beams and fixed-form or variable-form electron beams. A plasma dry etching process is also employed in the developing process of the invention.

In addition, the organic polymer layer of the present invention may be modified from the previously described positive resist to a negative resist. To accomplish this modification, a positive organic polymer layer should be uniformly exposed to a stronger electron beam during the drawing period, thereby changing said layer to a negative layer.

Thus, the present invention allows for the formation of an optionally positive or negative resist pattern completely without the use of a wet process.

Explanations of the organic polymer layer formation and dry etching processes of the present invention follow hereinafter with reference to the drawings.

FIG. 1 shows the resist layer formation and dry etching apparatuses related to the present invention. Items in the drawing labeled 701 to 706 are the first through sixth tanks containing etching gases, bombardment gases, carrier gases and the like, said gases being in vapor phase at room temperature. The tanks are connected, respectively, to the first through sixth control valves labeled 707 to 712 and the first through sixth flow controllers labeled 713 to 718. Items in the drawing labeled 719 to 721 are the first through third containers holding methacrylates incorporating fluorine or acrylates incorporating fluorine, said compounds being in liquid or solid phase at room temperature. These containers can be preheated so as to vaporize their contents via the first through third heaters 722 to 724, respectively. These containers are further connected to the seventh to ninth control valves 725 to 727 and the seventh to ninth flow controllers 728 to 730, respectively.

After these gases are combined in a mixer 731, they are conveyed to the reactor 733 via main pipe 732. The interconnecting pipe can be heated by an appropriate heater 734 which is suitably disposed so that the material compound, in a liquid or solid phase at room temperature and vaporized by preheating, will not condense during transport.

To power application electrode 736 are connected a highfrequency power source 739 via a high-frequency impedance matching device 738, a low-frequency power source 741 via a low-frequency impedance matching device 740, and a direct current (DC) power source 743 via a low-pass filter 742. Power of one of the different frequencies can be applied to the power application electrode 736 via the connection selecting switch 744. The internal pressure of the reactor 733 is adjustable by a pressure control valve 745. The reactor 733 is evacuated by a molecular turbopump 747 and oil rotary pump 748 via an exhaust system selecting valve 746, or by a cooling-removing device 749, a mechanical booster pump 750 and an oil rotary pump 748 via another exhaust system selecting valve 746. The exhaust gas is further made harmless by a suitable removal device 753 and then released to the atmosphere. The evacuation piping system can also be heated by a suitably disposed heater 734 so that the material compound which is liquid or solid at room temperature and vaporized by preheating will not condense during transport. For the same reason, the reactor 733 can also be heated by a reactor heater 751. An electrically conductive substrate 752 is placed on a grounded electrode 735 in the reactor. The substrate 752 may comprise, for example, a silicon wafer, glass plate, resin plate, metallic plate, and the like. Although substrate 752 is fixed to the grounded electrode 735, it may be attached to the power application electrode 736, or to both electrodes.

The resist layer formation and etching apparatuses related to the present invention which are shown in FIG. 1 are connectable via a gate valve, an electron beam exposure device for latent image formation and an alternate chamber for substrate desorption. The resist pattern can be formed on the substrate without breaking the vacuum by providing these connectable apparatuses.

The reactor for forming the organic polymer layer is first evacuated by the diffusion pump to a vacuum of about $10^{-4}$ to about $10^{-6}$ torr, whereby the adsorbed gas inside the reactor is removed. The reactor is also checked for the degree of vacuum. At the prescribed degree of vacuum, the substrate is either fixedly placed on the electrode or transported to said electrode using the gate valve and there fixed in place, said substrate then being heated to a predetermined temperature. Although the substrate may be fixed to either or both the power application electrode 736 and the grounded electrode 735, heating of both electrodes is preferred even when said substrate is fixed to only one electrode so as to maintain purity therebetween. Also, it is preferred that the electrode not fixed to the substrate preferably has a replaceable preventive panel previously mounted thereto, so as to maintain purity between the electrodes. Subsequently, material gases are fed into the reactor from the concerned first to third containers, each at a specified flow rate using the appropriate seventh to ninth flow controllers, and the interior of the reactor is maintained in a constant vacuum by the pressure control valve. After the combined flow of gases has stabilized, the low-frequency power source, for example, is selected by the connection selecting switch to apply low-frequency power to the power application electrode. This power application initiates a discharge across the two electrodes, forming a solid layer on the substrate with time. Although the substrate or substrate pre-processing may differ, an operation similar to that of the organic polymer layer formation may be planned to be performed prior to said polymer layer formation wherein etching or bombardment gases are fed into the reactor from the concerned first to sixth tanks and then discharged to assure the purity of the substrate surface or the adhesion between the substrate and the organic polymer layer. Also, carrier gases from the concerned first to sixth tanks may be simultaneously fed into the reactor during the organic polymer layer formation reaction to stabilize the discharge between the electrodes or to achieve thickness uniformity of the organic polymer layer, although the procedure may differ depending on the reactor model. Carrier gases conventionally used in plasma CVD reactions may be employed, such as hydrogen gas, argon gas or helium gas and the like. The formation of the organic polymer layer is conducted for a specified time and the discharge is temporarily arrested when the desired layer thickness is obtained. Next, the seventh to ninth regulator valves are closed, and the reactor is thoroughly exhausted.

The resist layer formed by the obtained organic polymer layer provides a negative-resist layer via a subsequent electron beam drawing process. When a positive-resist layer is required for the electron beam drawing process, carbon tetrafluoride gas from the concerned first to sixth tanks may be again fed into the reactor in an operation similar to that of the formation of the organic polymer layer. One of the major advantages of the present invention is that negative- and positive-resist layers are obtainable by means of only these few operations.

Next, the substrate with the resist layer of the present invention formed thereon is transported to the electron beam exposure apparatus, and a latent image is formed by conventional methods.

Subsequently, the substrate with the latent image formed thereon is again transported to the resist layer formation and dry etching apparatuses related to the present invention and shown in FIG. 1. In an operation similar to that of the organic polymer layer formation, etching gas from the concerned first to sixth tanks is fed into the reactor and discharged, thereby developing the latent image. Although various etching gases may be used, such as oxygen, nitrogen trifluoride, carbon tetrafluoride, and the like, oxygen is particularly preferred.

Resist patterns of optionally negative and positive images can be readily obtained without the use of a wet process by means of the resist pattern formation process of the series of present inventions.

Furthermore, the present invention is not restricted to the use of only methacrylates and acrylates incorporating fluorine, but may alternatively employ, for example, fluoroalkylsilanes. Examples of useful fluoroalkylsilanes are $CF_3CH_2CH_2Si(OCH_3)_3$, $CF_3CH_2CH_2SiCl_3$, $CF_3(CF_2)_5CH_2CH_2SiCl_3$, $CF_3(CF_2)_5CH_2CH_2Si(OCH_3)_3$, $CF_3(CF_2)_7CH_2CH_2CH_2SiCl_3$, $CF_3(CF_2)_7CH_2CH_2Si(OCH_3)_3$, $CF_3(CF_2)_7CH_2CH_2SiCH_3Cl_2 CF_3(CF_2)_7CH_2CH_2Si(CH_3)(OCH_3)_3$, and the like.

Examples of the present invention are explained hereinafter.

EXAMPLE 1

In resist layer formation and dry etching apparatuses related to the present invention and shown in FIG. 1, a high vacuum of $10^{-6}$ torr was created in the reactor 733, then the seventh control valve 725 was opened and 1H,1H,5H-octafluoropentylmethacrylate gas [$CH_2=C(CH_3)COOCH_2(CF_2)_4H$] was fed from the first container 719 to the seventh flow controller 728 and heated to a temperature of 75° C. by first heater 722. The dials on the flow controller were adjusted to supply the 1H,1H,5H-octafluoropentylmethacrylate gas at a flow rate of 6.8 sccm, then the gas was introduced into the reactor 733 via main pipe 732. After the gas flow stabilized, the internal pressure of the reactor was adjusted to 0.25 torr by the pressure control valve 745. On the other hand, a substrate 752 comprising two side-by-side 0.3 mm thick 10×10 mm silicon wafers was preheated to 160° C. With the gas flow and pressure in stabilized state, 105-watt power with a frequency of 30 kHz was applied to the power application electrode 736 from a low-frequency power source 741 previously connected thereto via connection selecting switch 744 to effect a plasma polymerization reaction for approximately 100 min, whereby an organic polymer layer with a thickness of 5 μm was formed on the substrate 752. Power application was terminated following layer formation, the control valve was closed and the reactor 733 was fully exhausted.

Figure 2:
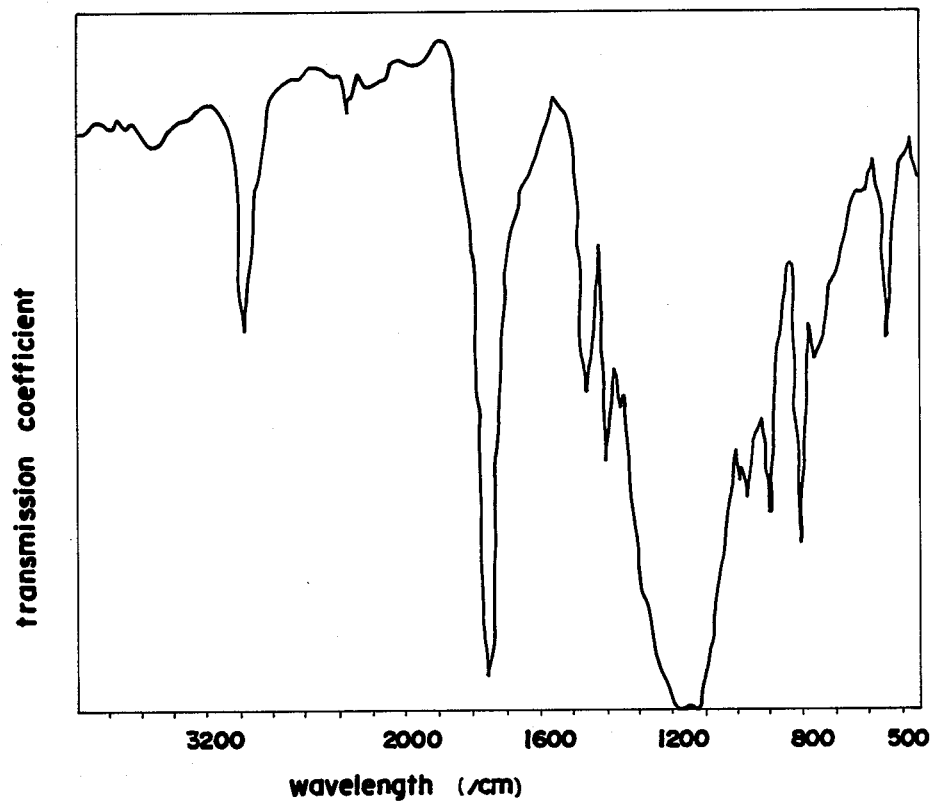
FIG. 2 shows the infrared absorption spectrum of the resist layer of the present invention.

When the resist layer comprising the organic polymer layer obtained in the aforesaid manner was subjected to quantitative analysis, it was found to contain 31 atomic % of hydrogen atoms, 24 atomic % of fluorine atoms and 5 atomic % of oxygen atoms based on the combined total amount of the aforesaid atoms. The resist layer infrared spectrum is as shown in FIG. 2.

Figure 3:
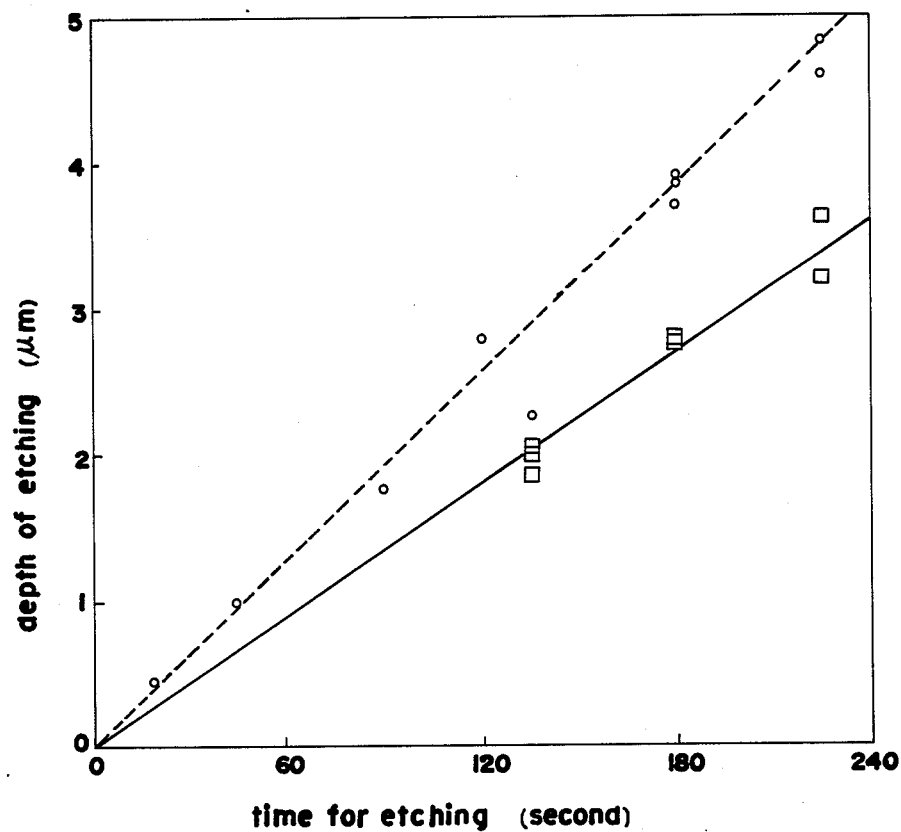
FIG. 3 shows the negative-resist characteristics of the resist layer of the present invention.

To assess the performance of the obtained two resist layers, one layer was first transported to an electron beam deposition device (JEBE-4B No. 41006, JEOL, Ltd.) and the entire resist surface was exposed to a soft-focus electron beam, then the vacuum was reduced to less than $2.6 \times 10^{-5}$ torr. Electron beam exposure was accomplished by a non-continuous interrupted exposure lasting 20 s ON and 20 s OFF in order to prevent a rise in temperature. The amount of electron exposure was up to 1 mC/cm². Next, the resist layer which was exposed to the electron beam as well as the resist layer which was not exposed were both again transported to the resist layer formation and dry etching apparatuses related to the present invention and shown in FIG. 1. Then, in an operation similar to that of the organic polymer layer formation process, oxygen gas was introduced into reactor 733 from the sixth tank 706, and a plasma etching process was performed by applying 13.56 MHz high-frequency power from the high-frequency power source 739 to the power application electrode 736. Differences in masked portions of the respective resist layers were measured with a dial gauge, and differences in the etching depth induced by exposure to the electron beam were observed. Results are shown in FIG. 3. The solid line in FIG. 3 indicates the etching characteristics of the resist layer exposed to the electron beam, while the dotted line indicates characteristics of the resist layer which was not exposed to the electron beam. The etching rate of the non-exposed resist layer was approximately 210 angstroms/s, which was about 1.4 times the exposed resist layer etching rate of 150 angstroms/s. These data confirm that the resist functions as a superior negative-resist layer.

EXAMPLE 2

The resist layer formation and dry etching apparatuses related to the present invention and shown in FIG. 1 were used to form an organic polymer layer with a thickness of 5 μm. Power application was terminated following layer formation, the control valve was closed and the reactor 733 was adequately evacuated to an order of $10^{-5}$ torr.

Subsequently, carbon tetrafluoride [$CF_4$] gas was fed from the first tank 701 to the first flow controller 713. The dials on the flow controller were adjusted to supply the carbon tetrafluoride [$CF_4$] gas at a flow rate of 6.8 sccm, then the gas was introduced into the reactor 733 via main pipe 732. After the gas flow stabilized, the internal pressure of the reactor was adjusted to 0.1 torr by the pressure control valve 745. With the gas flow and pressure in stabilized state, 100-watt power with a frequency of 13.56 MHz was applied to the power application electrode 736 from a high-frequency power source 739 previously connected thereto via connection selecting switch 744 to effect a plasma polymerization reaction for approximately 20 min, whereby an organic polymer layer was formed. Power application was terminated following layer formation, the control valve was closed and the reactor 733 was fully exhausted.

Figure 4:
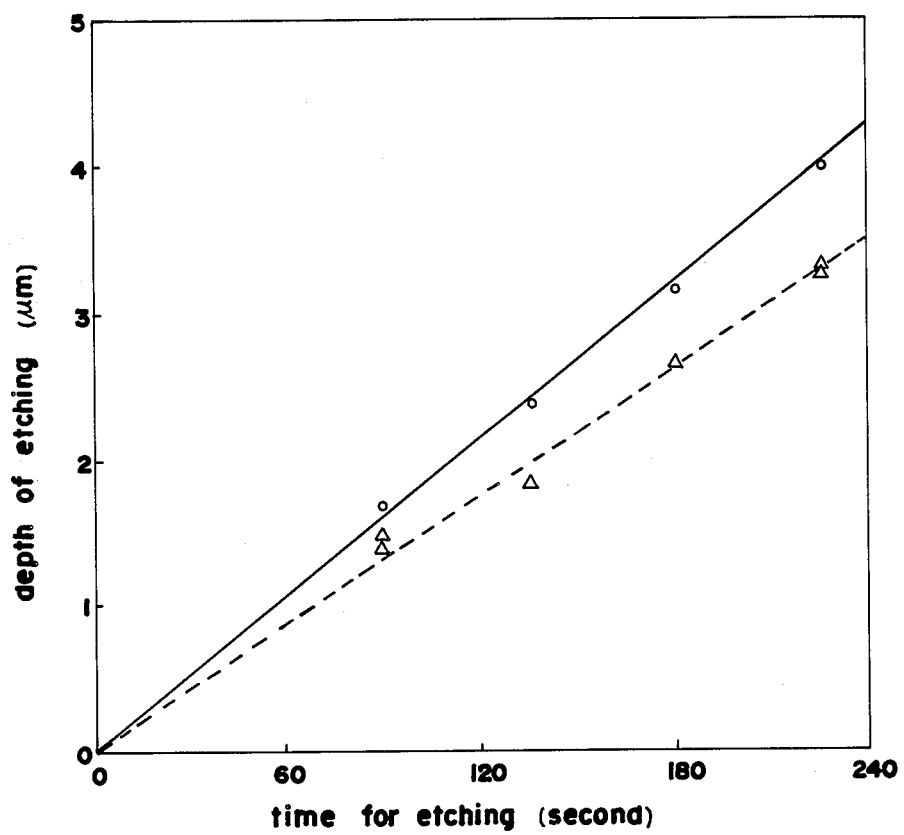
FIG. 4 shows the positive-resist characteristics of the resist layer of the present invention.

The resist layer comprising the organic polymer layer obtained in the aforesaid manner was subjected to latent image formation via electron beam exposure and a dry etching process using oxygen plasma in the same manner as described in Example 1, and thereafter assessed for performance. The results of this assessment are shown in FIG. 4. The solid line in FIG. 4 indicates the etching characteristics of the resist layer exposed to the electron beam, while the dotted line indicates characteristics of the resist layer which was not exposed to the electron beam. The etching rate of the exposed resist layer was approximately 180 angstroms/s, which was about 1.3 times the nonexposed resist layer etching rate of 145 angstroms/s. These data confirm that the resist functions as a superior positive-resist layer. Furthermore, the negative-resist layer of Example 1 is readily modifiable to a positive-resist layer via a carbon tetrafluoride plasma process as confirmed by the aforesaid data.

EXAMPLES 3 to 5

Organic polymer layers were formed in an identical manner to that in Example 1 with the exception of using as the material gases 2,2,2-trifluoroethylmethacrylate gas $CH_2=C(CH_3)COOCH_2CF_3$ (Example 3), 2,2,3,3-tetrafluoropropylmethacrylate gas $CH_2=C(CH_3)COOCH_2(CF_2)_2H$ (Example 4), and 1H,1H,2H,2H-heptadeca-fluorodecylmethacrylate gas $CH_2=C(CH_3)COO(CH_2)_2(CF_2)_8F$ (Example 5). The resist layers comprising the obtained organic polymer layers were assessed for performance using the same resist process as was used in Example 1. The etching rates of the resist layers which were not exposed to the electron beam were approximately 1.3 times (Example 3), 1.35 times (Example 4), and 1.5 times (Example 5) the etching rates of the respective exposed resist layers, thereby confirming that the respective resists function as superior negative-resist layers.

EXAMPLES 6 to 8

Organic polymer layers were formed in an identical manner to that in Example 2 with the exception of using as the material gases 2,2,2-trifluoroethylmethacrylate gas $CH_2=C(CH_3)COOCH_2CF_3$ (Example 6), 2,2,3,3-tetrafluoropropylmethacrylate gas $CH_2=C(CH_3)COOCH_2(CF_2)_2H$ (Example 7), and 1H,1H,2H,2H-heptadeca fluorodecylmethacrylate gas $CH_2=C(CH_3)COO(CH_2)_2(CF_2)_8F$ (Example 8). The resist layers comprising the obtained organic polymer layers were assessed for performance using the same resist process as was used in Example 2. The etching rates of the resist layers which were exposed to the electron beam were approximately 1.2 times (Example 6), 1.25 times (Example 7), and 1.45 times (Example 8) the etching rates of the respective non-exposed resist layers, thereby confirming that the respective resists function as superior positive-resist layers.

EXAMPLES 9 to 12

Organic polymer layers were formed in an identical manner to that in Example 1 with the exception of using as the material gases 2,2,2-trifluoroethylacrylate gas $CH_2=CHCOOCH_2CF_3$ (Example 9), 2,2,3,3-tetrafluoropropylacrylate gas $CH_2=CHCOOCH_2(CF_2)_2H$ (Example 10), 1H,1H,2H,2H-heptadeca-fluorodecylacrylate gas $CH_2=CHCOOCH_2(CF_2)_4H$ (Example 11), and 1H,1H,2H,2H-heptadecafluorodecylacrylate gas $CH_2=CHCOO(CH_2)_2(CF_2)_8F$ (Example 12), The resist layers comprising the obtained organic polymer layers were assessed for performance using the same resist process as was used in Example 1. The etching rates of the resist layers which were not exposed to the electron beam were approximately 1.3 times (Example 9), 1.35 times (Example 10), 1.4 times (Example 11), and 1.45 times (Example 12) the etching rates of the respective exposed resist layers, thereby confirming that the respective resists function as superior negative-resist layers.

EXAMPLES 13 to 16

Organic polymer layers were formed in an identical manner to that in Example 2 with the exception of using as the material gases 2,2,2-trifluoroethylacrylate gas $CH_2=CHCOOCH_2CF_3$ (Example b 13), 2,2,3,3-tetrafluoropropylacrylate gas $CH_2=CHCOOCH_2(CF_2)_2H$ (Example 14), 1H,1H,5H-octafluoropentylacrylate gas $CH_2=CHCOOCH_2(CF_2)_4F$ (Example 15), and 1H,1H,2H,2Hheptadecafluorodecylacrylate gas $CH_2=CHCOO(CH_2)_2(CF_2)_8F$ (Example 16). The resist layers comprising the obtained organic polymer layers were assessed for performance using the same resist process as was used in Example 2. The etching rates of the resist layers which were exposed to the electron beam were approximately 1.2 times (Example 13), 1.25 times (Example 14), 1.3 times (Example 15), and 1.4 times (Example 16) the etching rates of the respective non-exposed resist layers, thereby confirming that the respective resists function as superior positive-resist layers.

What is claimed is:

1. A resist pattern formation process comprising:
   a step of forming a resist layer comprising an organic polymer layer by subjecting at least a methacrylate incorporating fluorine and/or an acrylate incorporating fluorine to a glow-discharge plasma polymerization process;
   a step of plasma exposing said resist layer to a carbon tetrafluoride to be able to be used as a positive resist layer;
   a step of forming a latent image by exposing said resist layer to an electron beam; and
   a step of visualizing said latent image by plasma etching.

2. A resist layer comprising an organic polymer of a methacrylate incorporating fluorine and/or an acrylate incorporating fluorine, said resist layer being formed by subjecting said methacrylate incorporating fluorine and/or acrylate incorporating fluorine to a glow-discharge plasma polymerization process and subsequently exposing said resist layer to a carbon tetrafluoride plasma to be able to be used as a positive resist layer.

3. A resist layer as claimed in claim 2 having a thickness of about 0.01 to about 10 microns.

4. A resist layer as claimed in claim 2 formed with the deposition rate of about 0.001 to about 0.5 micron/minutes.

5. A resist layer as claimed in claim 2 wherein preferred methacrylate incorporating fluorine and/or an acrylate incorporating fluorine are 1H,1H,5H-octafluoropentylmethacrylate and 1H,1H,5H-octafluoropentylacrylate.

6. A resist layer comprising a substrate and an organic polymer layer formed on the substrate and comprising a methacrylate incorporating fluorine and/or an acrylate incorporating fluorine, said resist layer being formed by a process including a step of heating the substrate placed in a reactor chamber to a predetermined temperature; a step of introducing gaseous materials including methacrylate incorporating fluorine and/or acrylate incorporating fluorine into the reactor chamber; a step of causing plasma discharge in the reactor chamber while introducing the gaseous materials to form the organic polymer layer on the heated substrate; and a step of plasma exposing said resist layer to a carbon tetrafluoride to be able to be used as a positive resist layer.

* * * * *